United States Patent

Hayafuji et al.

[11] Patent Number: 5,874,753
[45] Date of Patent: Feb. 23, 1999

[54] FIELD EFFECT TRANSISTOR

[75] Inventors: Norio Hayafuji; Yoshitsugu Yamamoto, both of Tokyo, Japan

[73] Assignee: Mitsubishi Denki Kabushiki Kaisha, Tokyo, Japan

[21] Appl. No.: 827,059

[22] Filed: Mar. 26, 1997

[30] Foreign Application Priority Data

Nov. 12, 1996 [JP] Japan ............................ 8-300383

[51] Int. Cl.$^6$ ........................ H01L 29/778; H01L 29/772
[52] U.S. Cl. ........................................ 257/194; 257/192
[58] Field of Search ................................ 257/192, 194

[56] References Cited

U.S. PATENT DOCUMENTS

| 5,351,128 | 9/1994 | Gotto et al. | 257/192 |
| 5,677,553 | 10/1997 | Yamamoto et al. | 257/192 |
| 5,682,045 | 10/1997 | Hayafuji et al. | 257/192 |

FOREIGN PATENT DOCUMENTS 60-218876  11/1985  Japan .

OTHER PUBLICATIONS

Hayafuji et al., "Thermal Stability Of AlInAs/GaInAs/InP Heterostructures", Applied Physics Letters, vol. 66, No. 7, 1995, pp. 863–865.

Fujihara et al., "Thermally Stable InAlAs/InGaAs Heterojunction FET With AlAs/InAs Superlattice Insertion Layer", Electronics Letters, pp. 1039–1041.

Yamamoto et al., "Donor Passivation In n–AlInAS Layers By AT Fluorine", Journal of Electronic Materials, vol. 25, No. 4, 1996, 685–690.

Primary Examiner—John F. Guay
Attorney, Agent, or Firm—Leydig, Voit & Mayer

[57] ABSTRACT

In a field effect transistor including active layers having a heterojunction structure with at least two different semiconductor materials, a layer for supplying electrons is disposed opposite a drain electrode, in contact with a region of the active layers including a dopant impurity producing n type conductivity. Therefore, degradation of the electrical characteristics caused by trapping of electrons in a drain ohmic contact layer due to fluorine diffusing into the semiconductor layers is suppressed by supplying electrons from the layer opposite the drain electrode, thereby improving reliability of the field effect transistor including the heterojunction structure.

10 Claims, 12 Drawing Sheets

$$\frac{N_s}{N_{s0}} = \frac{\text{sheet carrier concentration after annealing}}{\text{sheet carrier concentration before annealing}}$$

○ : as grown
□ : annealed at 300°C
△ : annealed at 400°C
■ : annealed at 450°C 5,874,753

FIELD EFFECT TRANSISTOR

FIELD OF THE INVENTION

The present invention relates to a semiconductor device and a fabricating method thereof and, more particularly, to a semiconductor device structure and a fabricating method thereof for improving reliability of the semiconductor device.

BACKGROUND OF THE INVENTION

Extended Abstract WC2 pp.497–500 of Fifth International Conference on Indium Phosphide and Related Materials, held at Paris in France from 19th to 22nd Apr. 1993, discloses a prior art HEMT (high electron mobility transistor) shown in FIG. 12(a). FIG. 12(a) is a cross-sectional view illustrating the prior art HEMT structure with an n type InAlAs carrier supply layer on an InP substrate and with a Schottky forming layer on the n type InAlAs carrier supply layer. FIG. 12(b) is a diagram for explaining thermal degradation of the electrical characteristics of the HEMT.

In FIG. 12(a), reference numeral 101 designates a semi-insulating (hereinafter referred to as S.I.) InP substrate, numeral 102 designates an undoped InP layer having a thickness of about 10 nm, numeral 103 designates an undoped InGaAs channel layer having a thickness of about 20 nm, numeral 104 designates an undoped InAlAs spacer layer having a thickness of about 3 nm, numeral 105 designates an n$^+$ type InAlAs electron supply layer having a thickness of about 15 nm and a dopant concentration of $3\times10^{18}$ cm$^{-3}$, numeral 106 designates a Schottky forming layer comprising such as undoped In$_{0.75}$Ga$_{0.25}$P and having a thickness of about 10 nm, numeral 107 designates an n$^+$ type InGaAs ohmic layer having a thickness of about 20 nm and a dopant concentration of $5\times10^{18}$ cm$^{-3}$, numeral 108 designates a source electrode, numeral 109 designates a drain electrode, and numeral 110 designates a gate electrode.

In FIG. 12(b), the abscissa shows an annealing temperature (unit: °C.), and the ordinate shows a sheet carrier concentration (unit: $10^{12}$ cm$^{-2}$) of two-dimensional electron gas produced in the interface of the undoped InGaAs channel layer 103 at the side of the undoped InAlAs spacer layer 104. Circles, triangles and squares shown in the figure represent the cases where materials of the Schottky forming layer 106 are In$_{0.75}$Ga$_{0.25}$P, InP and InAlAs, respectively.

A description is given of the thermal degradation of the electrical characteristics of the HEMT. In the above-described literature, in order to investigate thermal stability of the HEMT shown in FIG. 12(a), Fujita, et al., the authors, prepared the same structures as the main structure of the HEMT shown in FIG. 12(a). Three kinds of semiconductor laminated structures were obtained by successively laminating the undoped InP layer 102, the undoped InGaAs channel layer 103, the undoped InAlAs spacer layer 104 and the n$^+$ type InAlAs electron supply layer 105 on the S.I. InP substrate 101, and subsequently laminating the Schottky forming layers 106 respectively comprising In$_{0.75}$Ga$_{0.25}$P, InP and InAlAs. These laminated structures were annealed at 300° C. or 350° C. for five minutes in an ambient of nitrogen, and measurements of sheet carrier concentrations of the two-dimensional electron gas produced in the interface of the undoped InGaAs channel layer 103 at the side of the undoped InAlAs spacer layer 104 were conducted for the respective laminated structures. The results are as illustrated in FIG. 12(b). As is known from the figure, regardless of the materials of the electrode layers 106, In$_{0.75}$Ga$_{0.25}$P, InP and InAlAs, the sheet carrier concentrations decreased by annealing at 300° C. or higher.

These results indicate that, when an HEMT is annealed at 300° C. or higher, the electrical characteristics of the HEMT are thermally degraded and a desired sheet carrier concentration of the two-dimensional electron gas is not obtained, so that there occur problems, such as an increase in resistance of a region where the two-dimensional electron gas is produced, failing to obtain expected HEMT characteristics. Concerning this phenomenon, Fujita, et al. reported that the decrease in surface sheet carrier concentration could be attributed to an increase in surface depletion layer caused by surface deterioration of the InAlAs layer.

Meanwhile, the inventors of the present invention have studied the thermal degradation of the electrical characteristics of the HEMT, as described in Applied Physics Letters Volume 66 No.7 pp.863–865. FIG. 13 is a cross-sectional view illustrating a semiconductor laminated structure used for the studies, and FIG. 14 is a graph showing the results obtained from the studies. In FIG. 13, reference numeral 111 designates an S.I. InP substrate, numeral 112 designates an intrinsic (hereinafter referred to as i-) AlInAs buffer layer having a thickness of 2500 Å, numeral 113 designates an i-GaInAs channel layer having a thickness of 500 Å, and numeral 114 designates an AlInAs electron supply layer having a thickness of 340 Å. The i-GaInAs channel layer 113 includes a two-dimensional electron gas layer 116 in the vicinity of the interface at the side of the AlInAs electron supply layer 114, and the AlInAs electron supply layer 114 includes a spacer layer 115, i.e., a layer portion where an Si planar doping is performed to a height of 20 Å from the interface with the i-GaInAs channel layer 113.

In FIG. 14, the abscissa shows an annealing temperature (unit: °C.), and the ordinate shows a relationship between sheet carrier concentration $N_{s0}$ of a two-dimensional electron gas layer before annealing and sheet carrier concentration $N_s$ thereof after annealing, i.e., $N_s/N_{s0}$.

The studies were carried out as follows. The semiconductor laminated structure similar to the HEMT structure shown in FIG. 13, with the AlIAs electron supply layer 114 planar-doped with Si on the i-GaInAs channel layer 113, was annealed at different temperatures for fifteen minutes in the nitrogen ambient. Then, the sheet carrier concentrations of the two-dimensional electron gas layer 116 formed in the vicinity of the interface of the i-GaInAs channel layer 113 at the side of the AlInAs electron supply layer 114 were measured by Hall effect measurements. As shown in FIG. 14, also in the above-described semiconductor laminated structure, the sheet carrier concentration decreases by annealing, which implies that an HEMT with its electrical characteristics degraded is fabricated by including an annealing process.

FIG. 15 is a cross-sectional view illustrating a semiconductor laminated structure used in studies for identifying the causes of the thermal degradation of the electrical characteristics of the prior art semiconductor device. In the figure, reference numeral 21 designates an S.I. InP substrate, numeral 22 designates an i-AlInAs layer having a thickness of about 4000 Å, and numeral 23 designates an AlInAs layer doped with Si as a dopant impurity and having a thickness of about 1300 Å.

The semiconductor laminated structures as shown in FIG. 15 were respectively formed in an MBE (molecular beam epitaxy) chamber by successively laminating the i-AlInAs layers 22 and the Si planar-doped AlInAs layers 23 on the S.I. InP substrates 21. After taking the semiconductor laminated structures out from the growth chamber, annealing was conducted for the laminated structures at temperatures of 300° C., 400° C., and 450° C. for fifteen minutes under the nitrogen ambient, respectively. Then, impurity species of the semiconductor laminated structures were measured by secondary ion mass spectroscopy (SIMS) measurement. The results of the impurity measurements are as illustrated in FIG. 16.

In FIG. 16, the abscissa shows a depth of the semiconductor laminated structure from its surface (unit: $\mu$m), and the ordinate shows a fluorine concentration (unit: $cm^{-3}$). White circles shown in the figure represent a fluorine profile for the as-grown semiconductor laminated structure, white squares represent a fluorine profile for the laminated structure that was annealed at 300° C., white triangles represent a fluorine profile for the laminated structure that was annealed at 400° C., and black squares represent a fluorine profile for the laminated structure that was annealed at 450° C.

The following facts were found by the above-described studies. $^{19}F$ (fluorine) was diffused into the semiconductor laminated structure by annealing, which was based on the results obtained by checking the whole mass of impurities and detecting the mass number 19 by SIMS measurement; the amount of $^{19}F$ increases as annealing temperature increases; $^{19}F$ was dominantly involved in the Si-doped layer; and $^{19}F$ was also accumulated at the interface between the epitaxial layers and the substrate.

From these facts, it is found out that fluorine ($^{19}F$) diffuses into the semiconductor laminated structure during annealing, which has not ever been known. Because no fluorine was detected for other materials, except for the Si-doped AlInAs layer 23, it is reasonably thought that the fluorine diffusion is a phenomenon peculiar to the AlInAs layer 23 doped with a dopant impurity, such as Si. In addition, when the origin of fluorine was investigated, it was found that no fluorine was used in the growth chamber of MBE or MOCVD which was used for the growth of the semiconductor laminated structure and that no fluorine was actively supplied in the laboratory. However, fluorine of about 0.3 atomic % was detected by analyzing the surface of the Si-doped AlInAs layer 23 just after the growth by electron spectroscopy for chemical analysis (ESCA). From these results, it is concluded that a small amount of fluorine, produced from hydrogen fluoride (HF) used for the semiconductor fabricating processes, remains in the air in the laboratory, and the fluorine in the air is attracted to and absorbed on the surface of the Si-doped AlInAs layer 23 when its surface is exposed to the air, resulting in the diffusion into the AlInAs layer 23.

Further, changes on standing in respective profiles (not shown) before and after annealing were investigated for elements such as Si and nitrogen, except for fluorine, and the respective profiles before and after annealing were almost the same.

As described above, the fluorine in the air diffuses into the Si-doped AlInAs layer 23 by annealing, and the profiles of the other elements do not change by annealing. Consequently, this phenomenon, i.e., the fluorine adsorption and diffusion by annealing, is thought to cause the thermal degradation of the electrical characteristics of the semiconductor device.

In order to avoid the degradation due to the fluorine diffusion, the fluorine remaining in the air may be completely removed. However, generally, in a plant where semiconductor fabrication is performed, the fluorine in the air remains without being completely removed, and complete removal of the fluorine is very difficult. Therefore, it is difficult to avoid fluorine diffusion.

Consequently, as long as the fluorine diffuses by annealing from the surface of the AlInAs layer doped with a dopant impurity, such as Si, which surface is exposed to the air, it is impossible to avoid the thermal degradation of a semiconductor device including a AlInAs layer doped with a dopant impurity.

In addition, it was ascertained that the thermal degradation occurred by retaining a lower temperature than the annealing temperatures used for the above-described studies, for a long time. FIG. 17 is a graph showing a relationship between carrier concentration of the Si-doped AlInAs layer 23 and time of retaining the temperature when the semiconductor laminated structure shown in FIG. 15 was annealed at 200° C. In the figure, the ordinate shows a carrier concentration (unit: $cm^{-3}$), and the abscissa shows time of retaining a temperature (hr). As is known from FIG. 17, the carrier concentration is decreased when the retaining time exceeds 100 hours at a low temperature of 200° C. This indicates that the thermal degradation of the semiconductor device occurs even at such a low temperature, and that the semiconductor device may be thermally degraded in the long term, even at a further low temperature, so that reliability of the semiconductor device is very low.

As described above, in a prior art semiconductor device including an AlInAs layer doped with a dopant impurity, like an HEMT, when thermal treatment is performed under an ambient including a carrier gas, such as nitrogen and hydrogen, degradation of the electrical characteristics, such as a decrease in sheet carrier concentration, occurs. Usually, in order to confirm reliability of a semiconductor device, the semiconductor device is operated at a high temperature, which is likely to degrade the semiconductor characteristics, thereby confirming changes of the characteristics on standing. In the prior art semiconductor device, however, because the sheet carrier concentration decreases in a reliability test including the thermal treatment, the obtained results are not satisfactory, failing to produce a semiconductor device having high reliability.

In addition, since the characteristics are thermally degraded as described above, it is very difficult to operate the prior art semiconductor device at a high temperature for a long time, while maintaining desired characteristics, which makes it difficult to provide a semiconductor device having high reliability in high-temperature operation.

Further, in a prior art method of fabricating a semiconductor device, when the fabricating method requires a thermal treating process at a high temperature after forming an AlInAs layer doped with a dopant impurity, the electrical characteristics of the AlInAs layer doped with a dopant impurity are thermally degraded, so that a semiconductor device having desired characteristics is not fabricated. For example, in an HEMT including the AlInAs layer doped with a dopant impurity as a carrier supply layer, the sheet carrier concentration of two-dimensional electron gas decreases due to the thermal degradation, so that desired operating characteristics are not obtained.

SUMMARY OF THE INVENTION

It is an object of the present invention to provide a field effect transistor having desired electrical characteristics and high reliability.

It is another object of the present invention to provide a method of fabricating the field effect transistor described above.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, in a field effect transistor in which active layers have a heterojunction structure comprising semiconductor materials of two kinds and above, a layer for supplying electrons is disposed just below a drain electrode, in contact with a region including an n type dopant impurity of the active layers. Therefore, degradation of the electrical characteristics, caused by that electrons in a drain ohmic contact layer are caught by fluorine diffusing into the semiconductor layers, is suppressed by supplying electrons from the layer disposed just below the drain electrode, thereby improving reliability of the field effect transistor including the heterojunction structure.

According to a second aspect of the present invention, the field effect transistor of the first aspect of the invention has a high electron mobility transistor (HEMT) structure. Therefore, degradation of the electrical characteristics, caused by that electrons in the drain ohmic contact layer are caught by fluorine diffusing into the semiconductor layers, is suppressed by supplying electrons from the layer disposed just below the drain electrode, thereby realizing an HEMT having improved reliability.

According to a third aspect of the present invention, in the field effect transistor of the second aspect of the invention, the active layers comprise AlInAs and GaInAs. Therefore, degradation of the electrical characteristics, caused by that electrons in the drain ohmic contact layer are caught by fluorine diffusing into the semiconductor layers, is suppressed by supplying electrons from the layer disposed just below the drain electrode, thereby realizing an AlInAs/GaInAs HEMT having improved reliability.

According to a fourth aspect of the present invention, in the field effect transistor of the third aspect of the invention, the layer for supplying electrons is an AlInAs layer including a high concentration n type dopant impurity, and the drain electrode is disposed on an n type GaInAs ohmic contact layer which is disposed on the AlInAs layer. Therefore, degradation of the electrical characteristics, caused by that electrons in the drain ohmic contact layer are caught by fluorine diffusing into the semiconductor layers, is suppressed by supplying electrons from the AlInAs layer including the high concentration n type dopant impurity, thereby realizing an AlInAs/GaInAs HEMT having improved reliability.

According to a fifth aspect of the present invention, in the field effect transistor of the third aspect of the invention, the layer for supplying electrons is a GaInAs layer including a high concentration n type dopant impurity, and the drain electrode is disposed directly on the GaInAs layer. Therefore, it is possible to suppress degradation of the electrical characteristics, caused by that electrons in the drain ohmic contact layer are caught by fluorine diffusing into the semiconductor layers, to facilitate its fabrication, and to stabilize the desired electrical characteristics, thereby realizing an AlInAs/GaInAs HEMT having improved reliability.

According to a sixth aspect of the present invention, in the field effect transistor of the first aspect of the invention, a layer for supplying electrons is further disposed just below a source electrode, in contact with the region including an n type dopant impurity of the active layers. Therefore, degradation of the electrical characteristics, caused by that electrons in the drain ohmic contact layer and a source ohmic contact layer are caught by fluorine diffusing into the semiconductor layers, is suppressed by supplying electrons from the respective layers disposed just below the drain and source electrodes, thereby improving reliability of the field effect transistor including the heterojunction structure.

According to a seventh aspect of the present invention, the field effect transistor of the sixth aspect of the invention has a high electron mobility transistor (HEMT) structure. Therefore, degradation of the electrical characteristics, caused by that electrons in the drain ohmic contact layer and the source ohmic contact layer are caught by fluorine diffusing into the semiconductor layers, is suppressed by supplying electrons from the respective layers disposed just below the drain and source electrodes, thereby realizing an HEMT having improved reliability.

According to an eighth aspect of the present invention, in the field effect transistor of the seventh aspect of the invention, the active layers comprise AlInAs and GaInAs. Therefore, degradation of the electrical characteristics, caused by that electrons in the drain ohmic contact layer and the source ohmic contact layer are caught by fluorine diffusing into the semiconductor layers, is suppressed by supplying electrons from the respective layers disposed just below the drain and source electrodes, thereby realizing an AlInAs/GaInAs HEMT having improved reliability.

According to a ninth aspect of the present invention, in the field effect transistor of the eighth aspect of the invention, the respective layers for supplying electrons disposed just below the drain and source electrodes are AlInAs layers including high concentration n type dopant impurities, and the drain and source electrodes are respectively disposed on n type GaInAs ohmic contact layers which are disposed on the AlInAs layers. Therefore, degradation of the electrical characteristics, caused by that electrons in the drain ohmic contact layer and the source ohmic contact layer are caught by fluorine diffusing into the semiconductor layers, is suppressed by supplying electrons from the respective AlInAs layers including the high concentration n type dopant impurities, thereby realizing an AlInAs/GaInAs HEMT having improved reliability.

According to a tenth aspect of the present invention, in the field effect transistor of the eighth aspect of the invention, the respective layers for supplying electrons disposed just below the drain and source electrodes are GaInAs layers including high concentration n type dopant impurities, and the drain and source electrodes are respectively disposed directly on the GaInAs layers. Therefore, it is possible to suppress degradation of the electrical characteristics, caused by that electrons in the drain ohmic contact layer and the source ohmic contact layer are caught by fluorine diffusing into the semiconductor layers, to facilitate its fabrication, and to stabilize the desired electrical characteristics, thereby realizing an AlInAs/GaInAs HEMT having improved reliability.

According to an eleventh aspect of the present invention, a method of fabricating a field effect transistor includes forming a semiconductor laminated structure including active layers having a heterojunction structure comprising semiconductor materials of two kinds and above, on a semi-insulating substrate, selectively etching and removing a region of the semiconductor laminated structure where a drain electrode is to be formed until the etching reaches at least a region of the active layers which is doped with an n type dopant impurity, from the front surface of the semiconductor laminated structure, burying a semiconductor layer including a high concentration n type dopant impurity in the region etched and removed, and forming a drain electrode on the semiconductor layer including the high concentration n type dopant impurity. Therefore, degradation of the electrical characteristics, caused by that electrons in a drain ohmic contact layer are caught by fluorine diffusing into the semiconductor layers, is suppressed by supplying electrons from the semiconductor layer including the high concentration n type dopant impurity, whereby a field effect transistor including the heterojunction structure having high reliability can be fabricated easily.

According to a twelfth aspect of the present invention, a method of fabricating a field effect transistor includes forming a semiconductor laminated structure including active layers having a heterojunction structure comprising semiconductor materials of two kinds and above, on a semi-insulating substrate, selectively etching and removing respective regions of the semiconductor laminated structure where drain and source electrodes are to be formed until the etching reaches at least a region of the active layers which is doped with an n type dopant impurity, from the front surface of the semiconductor laminated structure, burying semiconductor layers including high concentration n type dopant impurities in the respective regions etched and removed, and forming a drain electrode on the semiconductor layer including the high concentration n type dopant impurity and forming a source electrode on the other semiconductor layer including the high concentration n type dopant impurity. Therefore, degradation of the electrical characteristics, caused by that electrons in a drain ohmic contact layer and a source ohmic contact layer are caught by fluorine diffusing into the semiconductor layers, is suppressed by supplying electrons from the respective semiconductor layers including the high concentration n type dopant impurities formed just below the drain and source electrodes, whereby a field effect transistor including the heterojunction structure having high reliability can be fabricated easily.

According to a thirteenth aspect of the present invention, a field effect transistor comprises a semi-insulating InP substrate, an undoped AlInAs buffer layer disposed on the substrate, an undoped GaInAs electron transit layer disposed on a portion of the buffer layer, an undoped AlInAs spacer layer disposed on the electron transit layer, a Si planar-doped layer disposed on the spacer layer, an undoped AlInAs Schottky contact layer disposed on the Si planar-doped layer, a high concentration Si-doped AlInAs layer disposed on the other portion of the buffer layer, in contact with the respective side surfaces of the electron transit layer, the spacer layer, the Si planar-doped layer and the Schottky contact layer, a first Si-doped GaInAs ohmic contact layer disposed on the high concentration Si-doped AlInAs layer, a drain electrode disposed on the first Si-doped GaInAs ohmic contact layer, a gate electrode disposed on a region of the Schottky contact layer adjacent to the high concentration Si-doped AlInAs layer, a second Si-doped GaInAs ohmic contact layer disposed on a region of the Schottky contact layer, across the gate electrode from the first Si-doped GaInAs ohmic contact layer, and a source electrode disposed on the second Si-doped GaInAs ohmic contact layer. Therefore, degradation of the electrical characteristics, caused by that electrons in the drain ohmic contact layer are caught by fluorine diffusing into the semiconductor layers, is suppressed by supplying electrons from the high concentration Si-doped AlInAs layer, thereby realizing an AlInAs/GaInAs HEMT having improved reliability.

According to a fourteenth aspect of the present invention, a field effect transistor comprises a semi-insulating InP substrate, an undoped AlInAs buffer layer disposed on the substrate, an undoped GaInAs electron transit layer disposed on a portion of the buffer layer, an undoped AlInAs spacer layer disposed on the electron transit layer, a Si planar-doped layer disposed on the spacer layer, an undoped AlInAs Schottky contact layer disposed on the Si planar-doped layer, first and second high concentration Si-doped AlInAs layers disposed on both sides of the portion of the buffer layer where the electron transit layer is disposed, in contact with the respective side surfaces of the electron transit layer, the spacer layer, the Si planar-doped layer and the Schottky contact layer, a first Si-doped GaInAs ohmic contact layer disposed on the first high concentration Si-doped AlInAs layer, a drain electrode disposed on the first Si-doped GaInAs ohmic contact layer, a second Si-doped GaInAs ohmic contact layer disposed on the second high concentration Si-doped AlInAs layer, a source electrode disposed on the second Si-doped GaInAs ohmic contact layer, and a gate electrode disposed on the Schottky contact layer. Therefore, degradation of the electrical characteristics, caused by that electrons in the drain ohmic contact layer and the source ohmic contact layer are caught by fluorine diffusing into the semiconductor layers, is suppressed by supplying electrons from the first and second high concentration Si-doped AlInAs layers, thereby realizing an AlInAs/GaInAs HEMT having improved reliability.

DETAILED DESCRIPTION OF THE PREFERRED EMBODIMENTS

Embodiment 1

Figure 1:
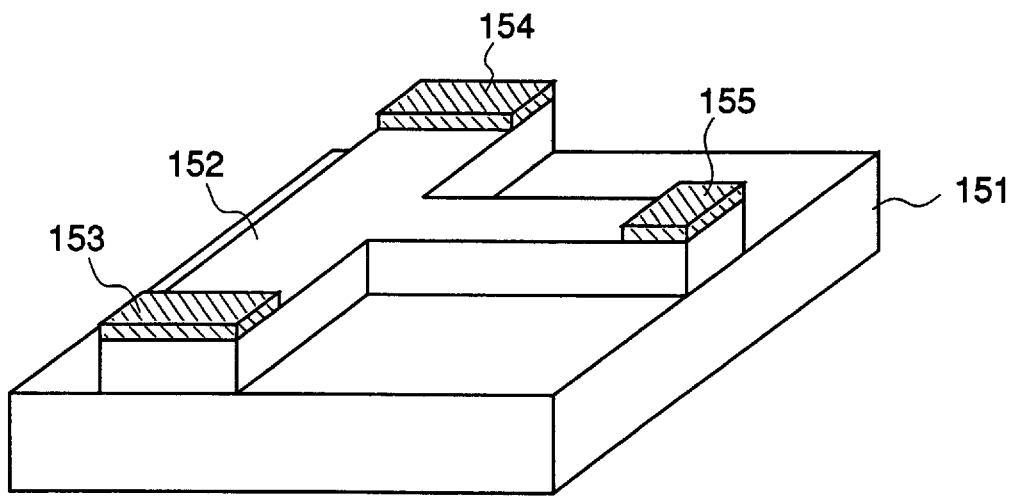
FIG. 1 is a perspective view illustrating a semiconductor sample used in a study for investigating the degradation mechanism of the electrical characteristics of a semiconductor device including a semiconductor layer into which fluorine diffuses, in actual operation.

FIG. 1 is a perspective view illustrating a semiconductor sample used in a study for investigating the degradation mechanism of the electrical characteristics of a semiconductor device including a semiconductor layer into which fluorine diffuses, in actual operation. In the figure, reference numeral 151 designates a semi-insulating (hereinafter referred to as S.I.) InP substrate, numeral 152 designates a Si-doped AlInAs layer, and numerals 153, 154 and 155 designate first, second and third ohmic electrodes, respectively. This structure is obtained by growing the Si-doped AlInAs layer 152 on the S.I. InP substrate 151 by MBE, selectively etching the AlInAs layer 152 with a mixture of tartaric acid and hydrogen peroxide, and forming the respective ohmic electrodes 153, 154 and 155 on the AlInAs layer 152.

In order to promote degradation of the electrical characteristics due to fluorine diffusion, the sample shown in FIG. 1 is previously exposed to hydrogen fluoride (HF) vapor, the sample is held in a nitrogen ambient at 250° C., and a voltage of 20 V is applied across the first ohmic electrode 153 and the second ohmic electrode 154 so that the second ohmic electrode 154 is at a positive voltage. Then, changes on standing of the voltages between the first ohmic electrode 153 and the third ohmic electrode 155 and between the second ohmic electrode 154 and the third ohmic electrode 155 are investigated.

Figure 2:
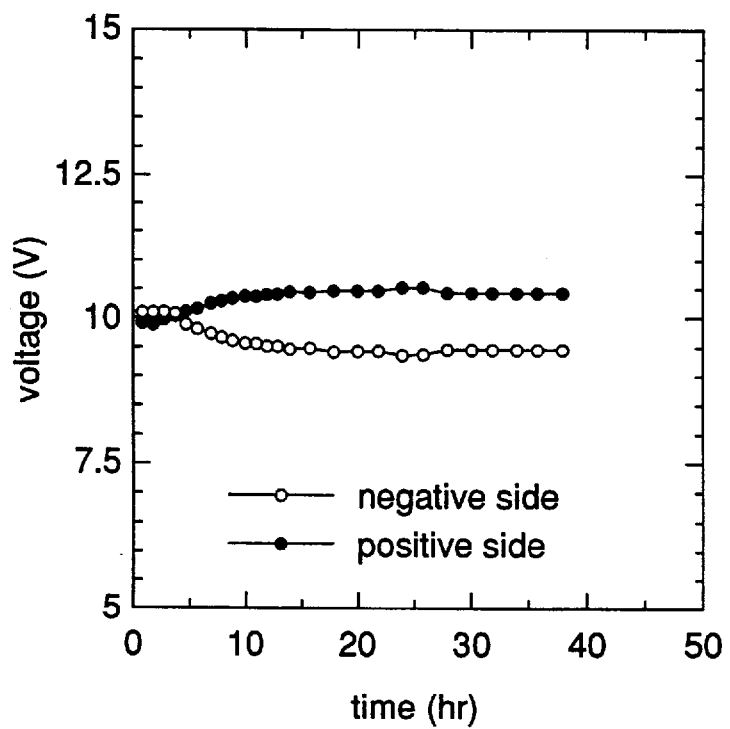
FIG. 2 is a graph showing voltage changes at the positive and negative sides in experiments using the sample shown in FIG. 1.

FIG. 2 is a graph showing the results of the investigation. It is found from the figure that the voltage at the positive side increases with the passage of time and is saturated after about 20 hours. This indicates that a decrease of carriers caused by fluorine thermally diffusing into the Si-doped AlInAs layer is accelerated by applying the electric field, and that its decrease is promoted especially in the vicinity of the positive electrode.

From this fact and the widely known facts, it is assumed that the characteristic degradation of the AlInAs/GaInAs HEMT due to heat and the electric field, i.e., a reliability defect for high temperature operation, progresses as follows:

1) fluorine in the air adsorbs on a surface of the AlInAs Schottky layer which is exposed to the air;

2) the fluorine thermally diffuses into the epitaxial layers;

3) the fluorine is concentrated in the vicinity of the positive electrode, i.e., drain electrode, due to the electric field;

4) F and Si react in the n type AlInAs electron supply layer;

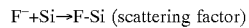

5) carriers decrease mainly in the vicinity of the drain electrode, resulting in the characteristic degradation.

As is known from these considerations, in order to improve the reliability of the AlInAs/GaInAs HEMT in high temperature conduction, it is required to avoid the decrease of carriers, especially in the vicinity of the drain electrode.

Figure 3:
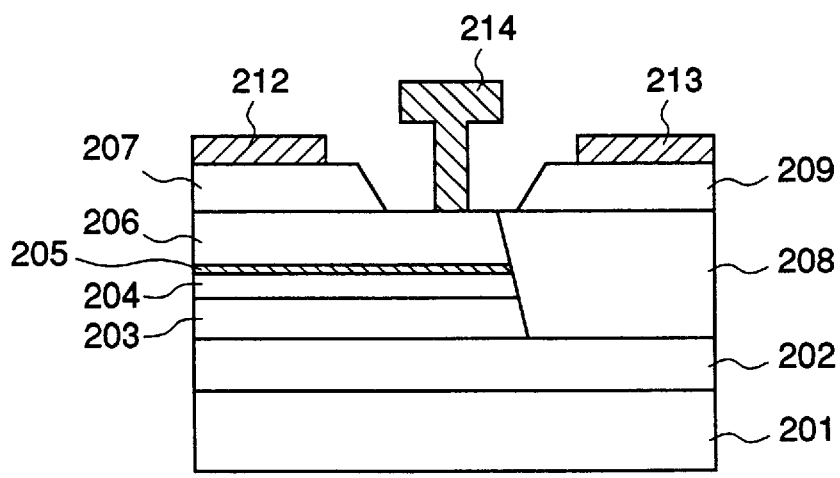
FIG. 3 is a cross-sectional view illustrating a semiconductor device in accordance with a first embodiment of the present invention.

FIG. 3 is a cross-sectional view illustrating a semiconductor device according to a first embodiment of the present invention. In the figure, reference numeral 201 designates a semi-insulating InP substrate, numeral 202 designates an undoped AlInAs buffer layer having a thickness of 250 nm, numeral 203 designates an undoped GaInAs electron transit layer having a thickness of 50 nm, numeral 204 designates an undoped AlInAs spacer layer having a thickness of 2 nm, numeral 205 designates a Si planar-doped layer having a sheet carrier concentration of $3 \times 10^{12}$ cm$^{-2}$, numeral 206 designates an undoped AlInAs Schottky contact layer having a thickness of 32 nm, numeral 207 designates a Si-doped GaInAs ohmic contact layer having a thickness of 50 nm and a carrier concentration of $4 \times 10^{18}$ cm$^{-3}$, numeral 208 designates a high concentration Si-doped AlInAs layer, and numeral 209 designates a Si-doped GaInAs ohmic contact layer. In order to make AlInAs and GaInAs lattice-match with the InP substrate, the compositions of AlInAs and GaInAs are strictly controlled to be $Al_{0.52}In_{0.48}As$ and $Ga_{0.53}In_{0.47}As$, respectively. Reference numeral 212 designates an AuGe/Ni/Au source electrode, numeral 213 designates an AuGe/Ni/Au drain electrode, and numeral 214 designates an Mo/Al/Mo gate electrode.

In addition, the distance between the high concentration Si-doped AlInAs layer 208 and the gate electrode 214 is 0.1 μm.

FIGS. 4(a)–4(g) are cross-sectional views illustrating process steps in a method of fabricating a semiconductor device according to the first embodiment of the invention. In these figures, the same reference numerals as shown in FIG. 3 designate the same or corresponding parts.

A description is given of the fabricating method.

Figure 4:
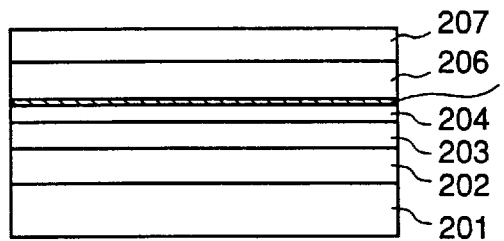
FIGS. 4(a)–4(g) are cross-sectional views illustrating process steps in a method of fabricating a semiconductor device according to the first embodiment of the invention.
Figure 4:
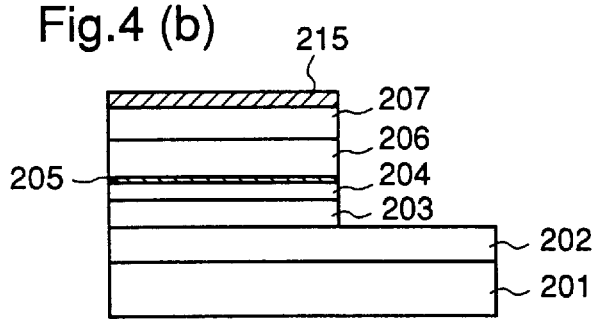
Figure 4:
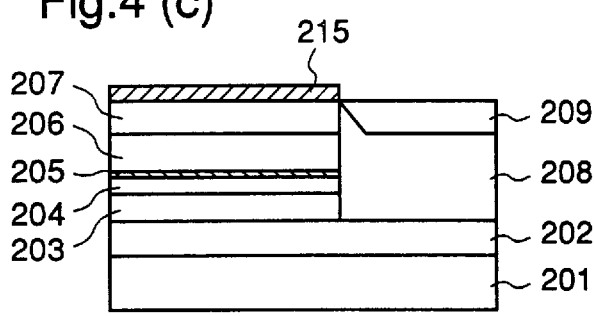
Figure 4:
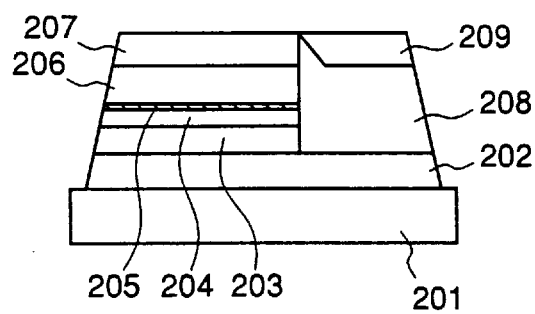
Figure 4:
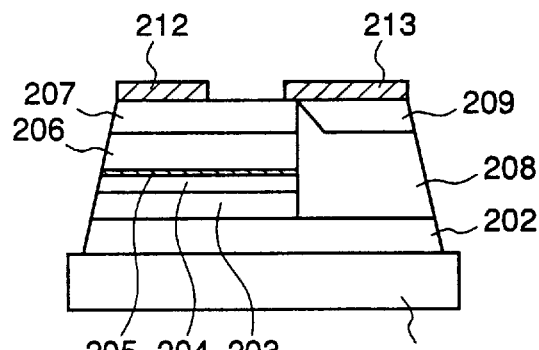
Figure 4:
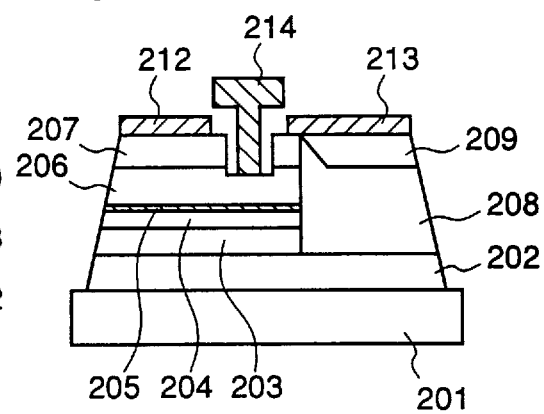
Figure 4:
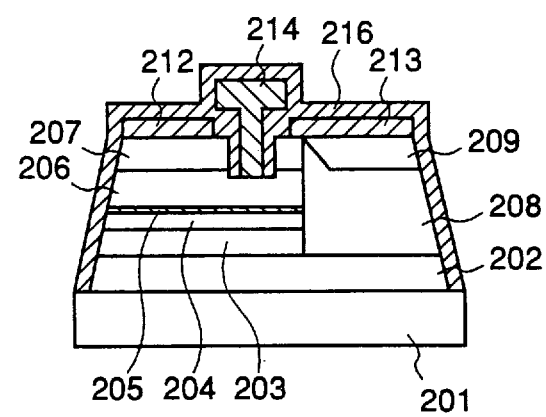

Initially, as shown in FIG. 4(a), the undoped AlInAs buffer layer 202, the undoped GaInAs electron transit layer 203, the undoped AlInAs spacer layer 204, the Si planar-doped layer 205, the undoped AlInAs Schottky contact layer 206, and the Si-doped GaInAs ohmic contact layer 207 are successively epitaxially grown on the semi-insulating InP substrate 201, preferably by MBE (molecular beam epitaxy), gas source MBE, CBE (chemical beam epitaxy), or MOCVD (metal organic chemical vapor deposition), to form a fundamental epitaxial structure of an AlInAs/GaInAs HEMT.

Next, an insulating film 215, such as SiNx, is formed on the entire front surface of the fundamental epitaxial structure, for example, by plasma CVD, and an opening is formed in the insulating film 215 by using a photolithographic technique or the like. Thereafter, using the insulating film 215 as a mask, the semiconductor layers exposed to the opening are selectively etched by chlorine based dry etching, wet etching or the like to form a groove. This etching is required to reach the Si planar-doped layer 205, and deeper etching may be performed. In FIG. 4(b), the etching reaches the undoped AlInAs buffer layer 202.

As shown in FIG. 4(c), the high concentration Si-doped AlInAs layer 208 and the Si-doped GaInAs layer 209 are successively grown in the groove formed by the etching, for example, by CBE or MOCVD. In this growth, storing as many electrons as possible is important. Therefore, it is important that the high concentration Si-doped AlInAs layer 208 should be doped with Si as much as possible without degrading its quality. In the first embodiment of the invention, the high concentration Si-doped AlInAs layer 208 is doped with Si to a concentration of $5 \times 10^{18}$ cm$^{-3}$.

After this, a final structure is formed with almost the same processes as those used for the prior art AlInAs/GaInAs HEMT.

After removing the insulating film 215, isolation of the respective elements is carried out by dry etching, wet etching, or isolating implantation of such as H. In the case shown in FIG. 4(d), the respective elements are isolated by forming a mesa groove reaching the semi-insulating InP substrate 201.

In the step of FIG. 4(e), the source electrode 212 and the drain electrode 213 of such as AuGe/Ni/Au are formed by vapor deposition, lift-off or the like.

Then, the Si-doped GaInAs ohmic contact layer 207 exposed between the source and drain electrodes is selectively etched, for example, with a mixture of citric acid and hydrogen peroxide, to expose the undoped AlInAs Schottky contact layer 206. Then, the gate electrode 214 of such as Mo/Al/Mo or Ti/Al/Mo is formed as shown in FIG. 4(f).

Finally, as shown in FIG. 4(g), an insulating film 216, such as SiNx or SiOxNy, is formed on the element surface, for example, by plasma CVD, for surface protection, completing the whole processes.

A description is given of the operation.

Figure 5:
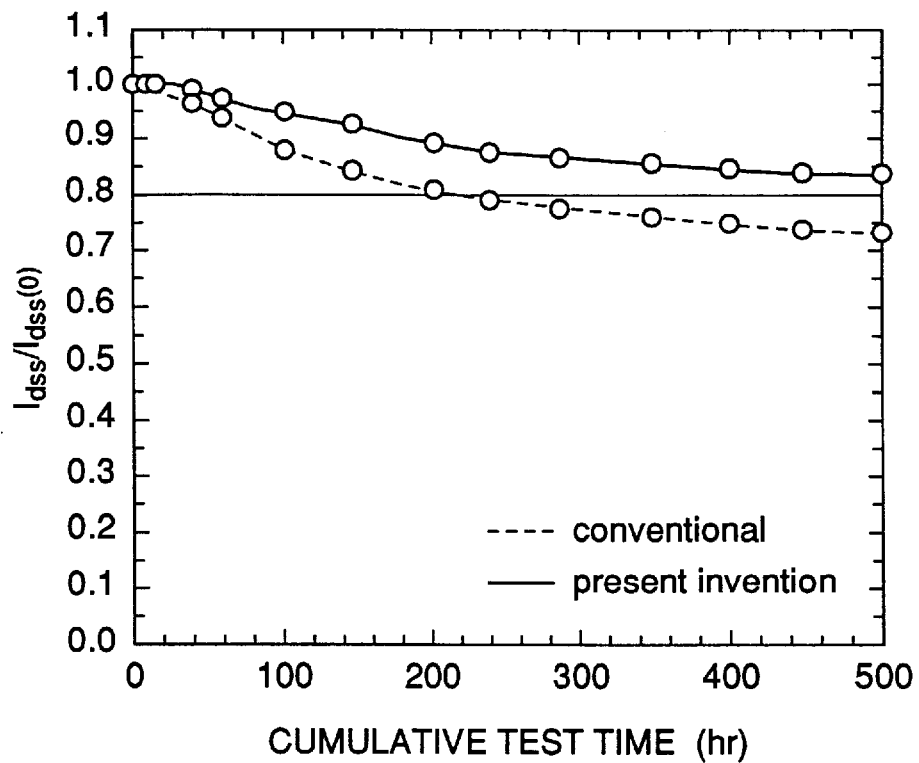
FIG. 5 is a graph for explaining effects according to the present invention.

FIG. 5 is a graph showing the results of conduction tests at 200° C. for the AlInAs/GaInAs HEMT shown in FIG. 3 as a semiconductor device according to the first embodiment. In the figure, the abscissa represents a cumulative test time for conduction, and the ordinate represents a conservation coefficient of $I_{dss}$, i.e., the drain current when the gate voltage is 0, to $I_{dss}(0)$, i.e., $I_{dss}$ before conduction. The results of the test for the prior art HEMT in which no high concentration Si-doped AlInAs layer is disposed just below the drain electrode are shown by a dotted line, and the results of the test for the HEMT according to the first embodiment are shown by a solid line. As is known from FIG. 5, in the semiconductor device of the first embodiment including the high concentration Si-doped AlInAs layer 208, the degree of $I_{dss}$ degradation during conduction becomes extremely small, that is, the reliability is exceptionally improved, as compared with the prior art HEMT. Assuming that the semiconductor device breaks down when $I_{dss}/I_{dss}(0)$, i.e., the conservation coefficient of $I_{dss}$ to $I_{dss}$ before conduction, is smaller than or equal to 0.8, the time taken to break down is remarkably extended from 200 hours to more than 500 hours.

It is thought that the result above mentioned is because the high concentration Si-doped AlInAs layer 208 disposed just below the drain electrode 213 supplies carriers (electrons) which decrease by coupling with the fluorine diffusing due to heat, that is, serves as an accumulator of electrons, so that the electrons conventionally trapped and inactivated by fluorine are compensated for.

As described above, the semiconductor device according to the first embodiment, i.e., the AlInAs/GaInAs HEMT, has a structure in which the high concentration Si-doped AlInAs layer 208 supplying the carriers (electrons) which decrease by coupling with the fluorine diffusing due to heat, that is, serving as an accumulator of electrons, is provided at the region just below the drain electrode 213. Therefore, a semiconductor device having high reliability, in which degradation of the electrical characteristics is suppressed, is realized.

In addition, in the HEMT shown in FIG. 3, the high concentration Si-doped AlInAs layer 208 is disposed directly on the undoped AlIAs buffer layer 202. However, because the high concentration Si-doped AlIAs layer 208 exhibits the same effects as described above when it makes contact with the Si planar-doped layer 205, it may be disposed, for example, directly on the GaInAs electron transit layer 203 or directly on the semi-insulating InP substrate 201.

Although Si is used as a donor dopant, another donor dopant, such as Sn, Te, or Se, can be employed with the same effects.

The composition, carrier concentration and thickness of each layer are not only those described in the first embodiment. Even when they are arbitrarily changed depending on desired characteristics, the same effects as described in the first embodiment can be obtained.

Embodiment 2

Figure 6:
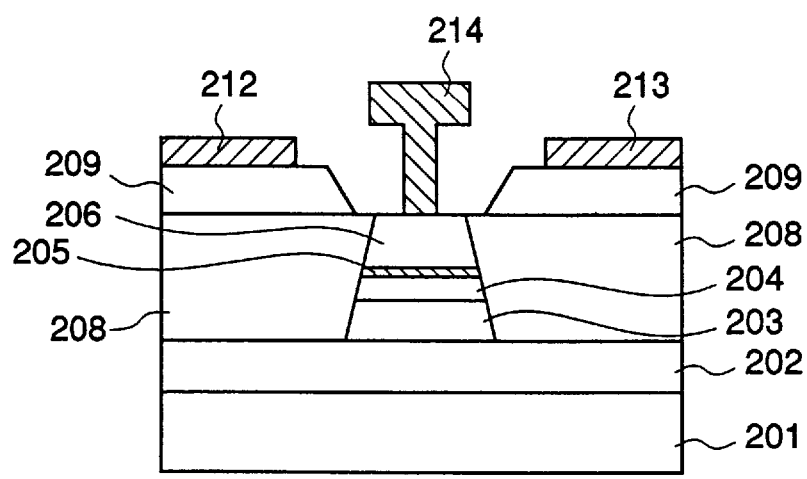
FIG. 6 is a cross-sectional view illustrating a semiconductor device in accordance with a second embodiment of the present invention.

FIG. 6 is a cross-sectional view illustrating a semiconductor device according to a second embodiment of the present invention. In the figure, the same reference numerals as shown in FIG. 3 designate the same or corresponding parts. According to the first embodiment of the invention, the high concentration Si-doped AlInAs layer 208 is only disposed just below the drain electrode 213. In practice, however, it is known that a measure of fluorine diffuses into the Si planar-doped layer region, except for the region in the vicinity of the drain electrode, and the source electrode side, and traps electrons. In the semiconductor device according to the second embodiment, including the structure of the semiconductor device shown in FIG. 3 according to the first embodiment, the high concentration Si-doped AlInAs layer is disposed also just below the source electrode, whereby the degradation due to the fluorine diffusion into the source electrode side is suppressed.

In the second embodiment of the invention, the process steps of fabricating a semiconductor device are the almost same as those used in the first embodiment, shown in FIGS. 4(a)–4(g). More specifically, the undoped AlInAs buffer layer 202, the undoped GaInAs electron transit layer 203, the undoped AlInAs spacer layer 204, the Si planar-doped layer 205, the undoped AlInAs Schottky contact layer 206, and the Si-doped GaInAs ohmic contact layer 207 are successively epitaxially grown on the semi-insulating InP substrate 201, preferably by MBE (molecular beam epitaxy), gas source MBE, CBE (chemical beam epitaxy), or MOCVD (metal organic chemical vapor deposition), to form a fundamental epitaxial structure of an AlInAs/GaInAs HEMT.

Then, an insulating film, such as SiNx, is formed on the entire front surface of the fundamental epitaxial structure, for example, by plasma CVD, and openings are formed in the insulating film by photolithographic technique or the like. While the opening is formed only on a portion of the epitaxial structure where the drain electrode is to be formed when the semiconductor device of the first embodiment is fabricated, in this embodiment the openings are formed on respective portions of the epitaxial structure where the drain and source electrodes are to be formed. Thereafter, using the insulating film having the openings as a mask, the semiconductor layers exposed to the openings are selectively etched by chlorine based dry etching, wet etching or the like to form grooves. This etching is required to reach the Si planar-doped layer 205, and deeper etching may be performed. Subsequently, the high concentration Si-doped AlInAs layer 208 and the Si-doped GaInAs layer 209 are successively grown in the grooves formed by the etching where the drain and source electrodes are to be formed, for example, by CBE or MOCVD. After this, the same process steps as shown in FIGS. 4(d)–4(g) are performed.

In a conduction test at 200° C., for the AlInAs/GaInAs HEMT shown in FIG. 6, the time taken to break down is further improved by about 20%, as compared with the case of the semiconductor device shown in FIG. 3 according to the first embodiment. It is thought that this is because the carrier decrease due to the fluorine at the side of the source electrode is suppressed by supplying electrons from the high concentration Si-doped AlInAs layer 208 disposed just below the source electrode.

As described above, the semiconductor device according to the second embodiment, i.e., the AlInAs/GaInAs HEMT, has a structure in which the high concentration Si-doped AlInAs layer 208 supplying the carriers (electrons) that decrease by coupling with the fluorine diffusing due to heat, that is, serving as an accumulator of electrons, is provided at the region just below the drain electrode 213 and the region just below the source electrode 212. Therefore, a semiconductor device having high reliability, in which degradation of the electrical characteristics is suppressed, is realized.

In addition, in the HEMT shown in FIG. 6, the high concentration Si-doped AlInAs layer 208 is disposed directly on the undoped AlInAs buffer layer 202. However, because the high concentration Si-doped AlInAs layer 208 exhibits the same effects as described above when it makes contact with the Si planar-doped layer 205, it may be disposed, for example, directly on the GaInAs electron transit layer 203 or directly on the semi-insulating InP substrate 201.

Although Si is used as a donor dopant, another donor dopant, such as Sn, Te, or Se, can be employed with the same effects.

Embodiment 3

Figure 7:
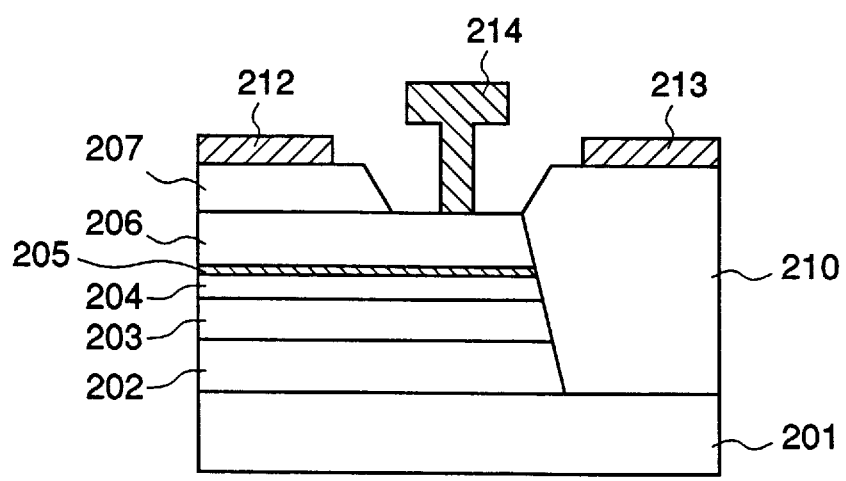
FIG. 7 is a cross-sectional view illustrating a semiconductor device in accordance with a third embodiment of the present invention.

FIG. 7 is a cross-sectional view illustrating a semiconductor device according to a third embodiment of the present invention. In the figure, the same reference numerals as shown in FIG. 3 designate the same or corresponding parts. Reference numeral 210 designates a high concentration Si-doped GaInAs layer. According to the first and second embodiments of the invention, the Si-doped GaInAs ohmic contact layer 209 is disposed on the high concentration Si-doped AlInAs layer 208 serving as the accumulator of electrons. However, in the semiconductor device according to the third embodiment, the layer serving as the accumulator of electrons is the high concentration Si-doped GaInAs layer, and the drain electrode directly makes ohmic contact with the high concentration Si-doped GaInAs layer.

FIGS. 8(a)–8(g) are cross-sectional views illustrating process steps in a method of fabricating a semiconductor device according to the third embodiment of the invention. In these figures, the same reference numerals as shown in FIG. 7 designate the same or corresponding parts.

A description is given of the fabricating method.

Figure 8:
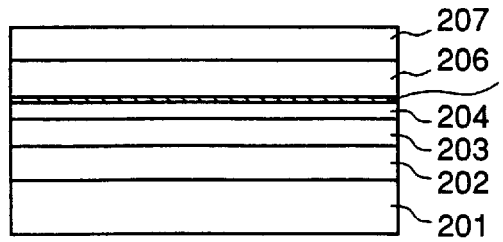
FIGS. 8(a)–8(g) are cross-sectional views illustrating process steps in a method of fabricating a semiconductor device according to the third embodiment of the invention.
Figure 8:
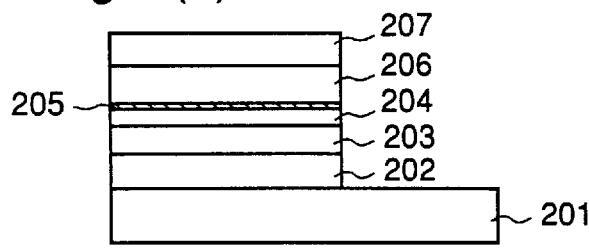
Figure 8:
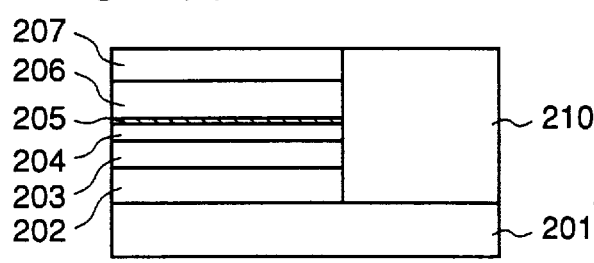
Figure 8:
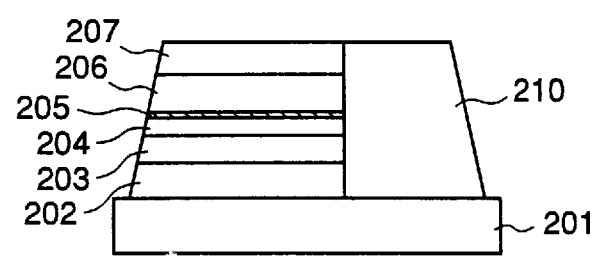
Figure 8:
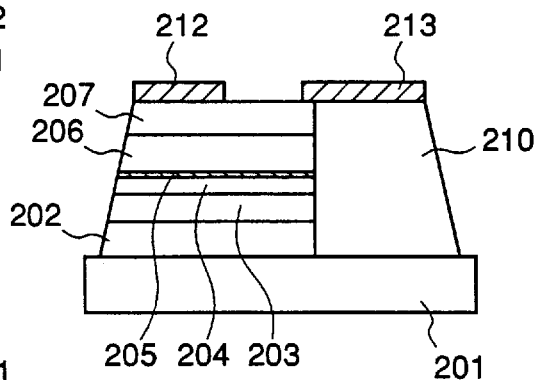
Figure 8:
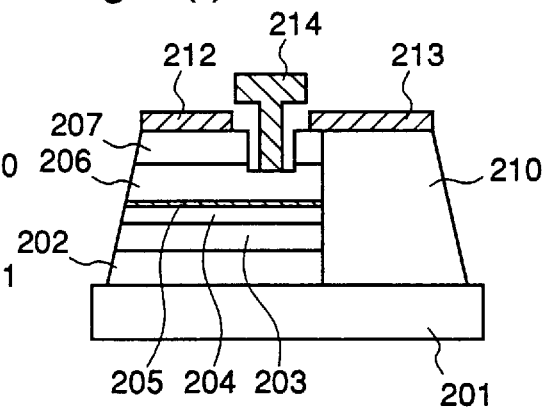
Figure 8:
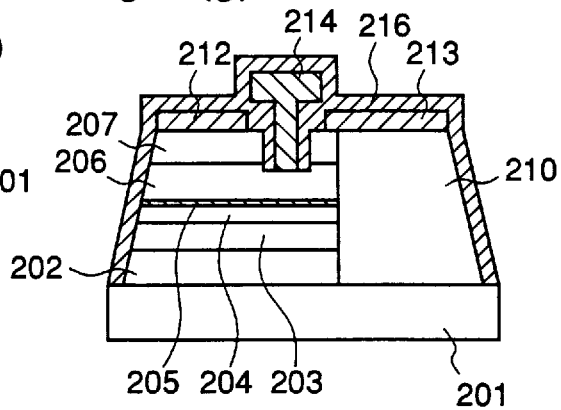

Initially, as shown in FIG. 8(a), the undoped AlInAs buffer layer 202, the undoped GaInAs electron transit layer 203, the undoped AlInAs spacer layer 204, the Si planar-doped layer 205, the undoped AlInAs Schottky contact layer 206, and the Si-doped GaInAs ohmic contact layer 207 are successively epitaxially grown on the semi-insulating InP substrate 201, preferably by MBE (molecular beam epitaxy), gas source MBE, CBE (chemical beam epitaxy), or MOCVD (metal organic chemical vapor deposition), to form a fundamental epitaxial structure of an AlInAs/GaInAs HEMT.

Next, an insulating film, such as SiNx, is formed on the entire front surface of the fundamental epitaxial structure, for example, by plasma CVD, and the insulating film on a portion of the epitaxial structure where the drain electrode is to be formed is removed to form an opening using a photolithographic technique or the like. Thereafter, as shown in FIG. 8(b), using the insulating film as a mask, the semiconductor layers exposed to the opening are selectively etched by chlorine based dry etching, wet etching or the like to form a groove. This etching is required to reach the Si planar-doped layer 205, and deeper etching may be performed. In FIG. 8(b), the etching reaches the semi-insulating InP substrate 201.

As shown in FIG. 8(c), the high concentration Si-doped GaInAs layer 210 is grown in the groove formed by the etching, for example, by CBE or MOCVD. In this growth, storing as many electrons as possible is important. Therefore, it is important that the high concentration Si-doped GaInAs layer 210 should be doped with Si as much as possible without degrading its quality.

After this, a final structure is formed with the almost same processes as those used for the prior art AlInAs/GaInAs HEMT.

After removing the insulating film, isolation of the respective elements is carried out by dry etching, wet etching, or isolating implantation of such as H. In the case shown in FIG. 8(d), the respective elements are isolated by forming a mesa groove reaching the semi-insulating InP substrate 201 by etching.

In the step of FIG. 8(e), the source electrode 212 and the drain electrode 213 of such as AuGe/Ni/Au are formed by vapor deposition, lift-off or the like.

Then, the Si-doped GaInAs ohmic contact layer 207 exposed between the source and drain electrodes is selectively etched, for example, with a mixture of citric acid and hydrogen peroxide, to expose the undoped AlInAs Schottky contact layer 206. Then, the gate electrode 214 of such as Mo/Al/Mo or Ti/Al/Mo is formed as shown in FIG. 8(f).

Finally, as shown in FIG. 8(g), the insulating film 216, such as SiNx or SiOxNy, is formed on the element surface, for example, by plasma CVD, for surface protection, completing the whole process.

In the semiconductor device shown in FIG. 7 according to the third embodiment, similar to the semiconductor device according to the first embodiment, the reliability during conduction at 200° C. is improved, i.e., the time taken to break down extends from 200 hours in the prior art structure to about 500 hours. It is thought that this result is because the carrier decrease at the drain side of the Si planar-doped layer 205 just below the gate is compensated for from the high concentration Si-doped GaInAs layer 210.

As described above, the semiconductor device according to the third embodiment, i.e., the AlInAs/GaInAs HEMT, has a structure in which the high concentration Si-doped GaInAs layer 210 supplying the carriers (electrons) which decrease by coupling with the fluorine diffusing due to heat, that is, serving as the accumulator of electrons, is provided at the region directly under the drain electrode 213. Therefore, a semiconductor device having high reliability, in which degradation of the electrical characteristics is suppressed, is realized. Further, in the semiconductor device of the third embodiment, the layer serving as the accumulator of electrons is the high concentration Si-doped GaInAs layer, and the drain electrode directly makes ohmic contact with the high concentration Si-doped GaInAs layer. Accordingly, compared with the case of the semiconductor device according to the first or second embodiment, it is possible to reduce the number of semiconductor layers regrown and to facilitate fabrication, and furthermore, since no heterojunction is formed at the contact portion, stability of the device characteristics can be improved.

In the HEMT shown in FIG. 7, the high concentration Si-doped GaInAs layer 210 is disposed directly on the semi-insulating InP substrate 201. However, because the high concentration Si-doped GaInAs layer 210 exhibits the same effects as described above when it makes contact with the Si planar-doped layer 205, it may be disposed, for example, directly on the undoped AlInAs buffer layer 202 or directly on the GaInAs electron transit layer 203.

Although Si is used as a donor dopant, another donor dopant, such as Sn, Te, or Se, can be employed with the same effects.

In addition, in the third embodiment of the invention, the high concentration Si-doped GaInAs layer 210 is disposed only directly under the drain electrode 213. However, the high concentration Si-doped GaInAs layer 210 may be disposed also directly under the source electrode, whereby the degradation due to the fluorine diffusion into the source electrode side can be suppressed. In such a modification of the semiconductor device according to the third embodiment, process steps of fabricating a semiconductor device are the almost same as those used for the semiconductor device of the third embodiment, shown in FIGS. 8(a)–8(g). More specifically, the undoped AlInAs buffer layer 202, the undoped GaInAs electron transit layer 203, the undoped AlInAs spacer layer 204, the Si planar-doped layer 205, the undoped AlInAs Schottky contact layer 206, and the Si-doped GaInAs ohmic contact layer 207 are successively epitaxially grown on the semi-insulating InP substrate 201, preferably by MBE (molecular beam epitaxy), gas source MBE, CBE (chemical beam epitaxy), or MOCVD (metal organic chemical vapor deposition), to form a fundamental epitaxial structure of an AlInAs/GaInAs HEMT.

Then, an insulating film, such as SiNx, is formed on the entire front surface of the fundamental epitaxial structure, for example, by plasma CVD, and openings are formed in the insulating film using a photolithographic technique or the like. While the opening is formed only on a portion of the epitaxial structure where the drain electrode is to be formed when the semiconductor device of the third embodiment is fabricated, the openings are formed on respective portions of the epitaxial structure where the drain and source electrodes are to be formed in the semiconductor device as a modification of the third embodiment. Thereafter, using the insulating film having the openings as a mask, the semiconductor layers exposed to the openings are selectively etched by chlorine based dry etching, wet etching or the like to form grooves. This etching is required to reach the Si planar-doped layer 205, and deeper etching may be performed.

Subsequently, the high concentration Si-doped GaInAs layer 210 is grown in the grooves formed by the etching in the portions where the drain and source electrodes are to be formed, for example, by CBE or MOCVD. After this, the same process steps as shown in FIGS. 8(d)–8(g) are performed.

In a conduction test at 200° C. for the semiconductor device as the modification of the third embodiment, the time taken to break down is further improved by about 10%, as compared with the case of the semiconductor device shown in FIG. 7 according to the third embodiment. It is thought that this is because the carrier decrease due to the fluorine at the side of the source electrode is suppressed by supplying electrons from the high concentration Si-doped GaInAs layer 210 disposed directly under the source electrode.

In this modification, although Si is used as a donor dopant, another donor dopant, such as Sn, Te, or Se, can be employed with the same effects.

Embodiment 4

In the first to third embodiments of the invention, the semiconductor device having an HEMT structure in which the channel layer (electron transit layer) is not doped is described. The present invention can be also applied to a channel doped type heterostructure field effect transistor (HFET), with the same effects as obtained in the first to third embodiments of the invention.

Figure 9:
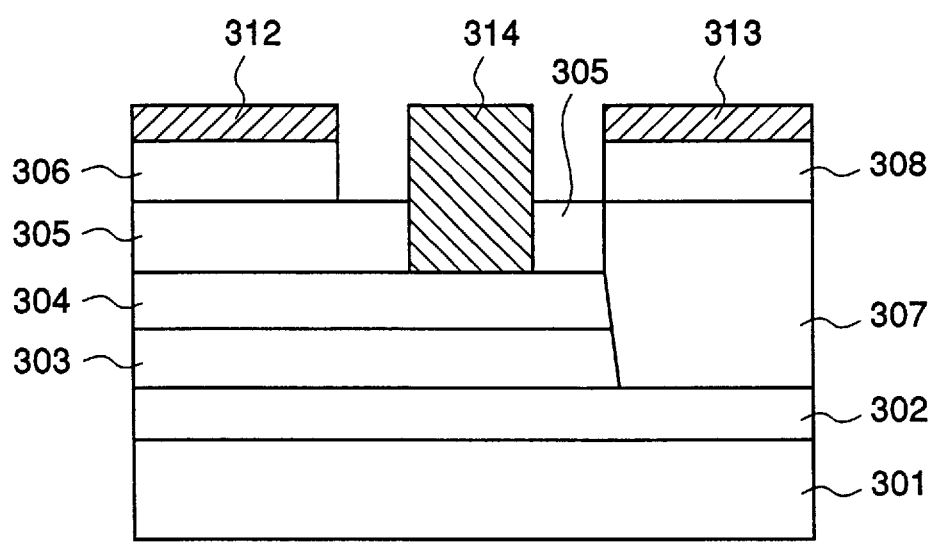
FIG. 9 is a cross-sectional view illustrating a semiconductor device in accordance with a fourth embodiment of the present invention.

FIG. 9 is a cross-sectional view illustrating a semiconductor device according to a fourth embodiment of the present invention. In the figure, reference numeral 301 designates a semi-insulating InP substrate, numeral 302 designates an Fe-doped InP buffer layer, numeral 303 designates a Si-doped n type InP electron transit layer, numeral 304 designates a Si-doped n type AlInAs Schottky contact layer, numeral 305 designates a Si-doped n⁻ type AlInAs field relaxation layer, numeral 306 designates a Si-doped n type GaInAs ohmic contact layer, numeral 307 designates a high concentration Si-doped AlInAs layer, and numeral 308 designates a Si-doped GaInAs ohmic contact layer. Reference numeral 312 designates a source electrode, numeral 313 designates a drain electrode, and numeral 314 designates a gate electrode. The carrier concentration of the high concentration Si-doped AlInAs layer 307 is larger than those of the Si-doped n type InP electron transit layer 303 and the Si-doped n type AlInAs Schottky contact layer 304 by one order of magnitude.

In the semiconductor device shown in FIG. 9, similar to the semiconductor device according to the first embodiment, the high concentration Si-doped AlInAs layer 307 is disposed only below the drain electrode 313, whereby electrons are supplied to the region where the electrons were conventionally trapped and inactivated by the fluorine, so that the degree of $I_{dss}$ degradation during conduction becomes extremely small, that is, the reliability is exceptionally improved.

As described above, the semiconductor device according to the fourth embodiment, i.e., the channel doped type HFET, has a structure in which the high concentration Si-doped AlInAs layer 307 supplying the carriers (electrons) which decrease by coupling with the fluorine diffusing due to heat, that is, serving as an accumulator of electrons, is provided at the region just below the drain electrode 313. Therefore, a semiconductor device having high reliability, in which degradation of the electrical characteristics is suppressed, can be realized.

Figure 10:
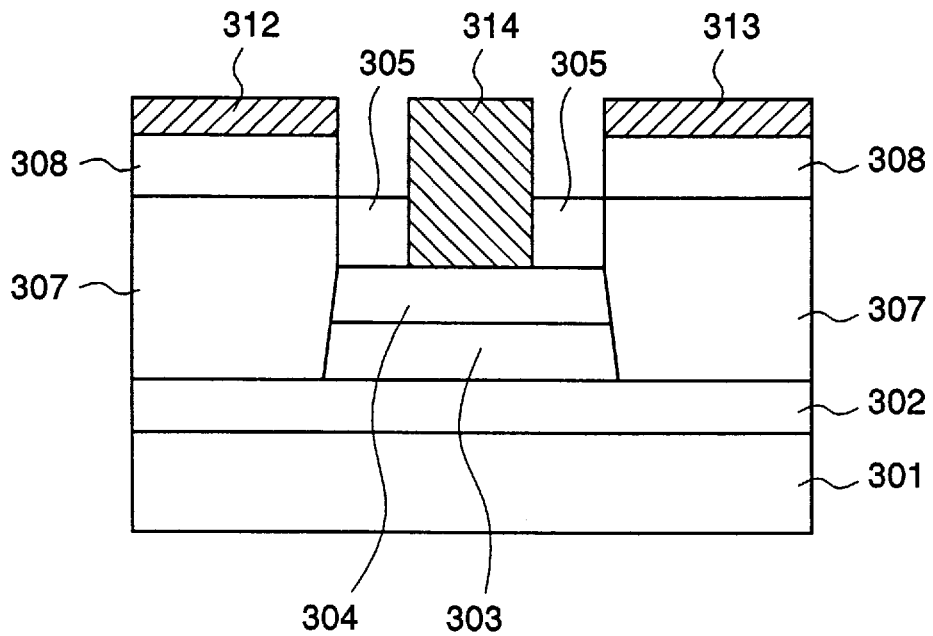
FIG. 10 is a cross-sectional view illustrating a semiconductor device according to a modification of the fourth embodiment of the invention.

In addition, in the fourth embodiment of the invention, the high concentration Si-doped AlInAs layer 307 is disposed only just below the drain electrode. However, the high concentration Si-doped AlInAs layer 307 may be disposed also just below the source electrode, whereby the degradation due to the fluorine diffusion into the source electrode side can be suppressed. FIG. 10 is a cross-sectional view illustrating a semiconductor device as such a modification of the semiconductor device according to the fourth embodiment. In the figure, the same reference numerals as shown in FIG. 9 designate the same or corresponding parts. In the semiconductor device as the modification of the fourth embodiment, shown in FIG. 10, electrons are supplied from the high concentration Si-doped AlInAs layer 307 just below the drain electrode and from the high concentration Si-doped AlInAs layer 307 just below the source electrode, so that the reliability of the channel doped type HFET can be further improved, as compared with the case of the semiconductor device shown in FIG. 9 according to the fourth embodiment.

Further, while in the fourth embodiment, the Si-doped GaInAs ohmic contact layer 308 is disposed on the high concentration Si-doped AlInAs layer 307 serving as the accumulator of electrons, the layer serving as the accumulator of electrons may be the high concentration Si-doped GaInAs layer, and the drain electrode may directly make ohmic contact with the high concentration Si-doped GaInAs layer.

Figure 11:
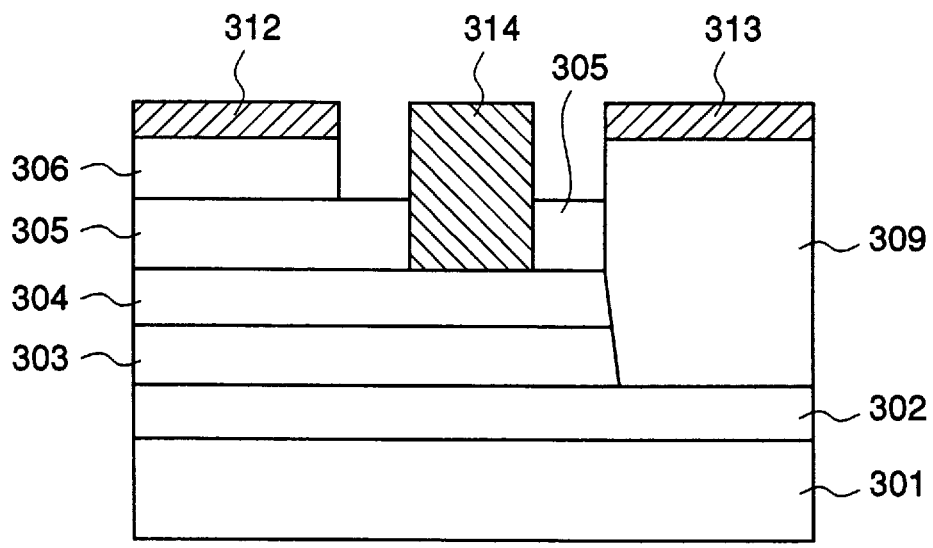
FIG. 11 is a cross-sectional view illustrating a semiconductor device according to another modification of the fourth embodiment of the invention.
Figure 12:
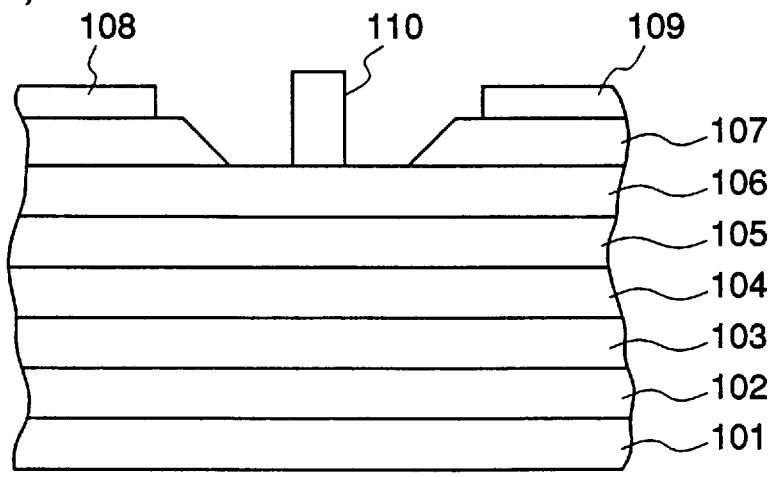
FIG. 12(a) is a cross-sectional view illustrating an AlInAs/GaInAs HEMT structure as an instance of a prior art semiconductor device.
FIG. 12(b) is a diagram showing degradation of the electrical characteristics of the HEMT, caused by thermal treatment.
Figure 12:
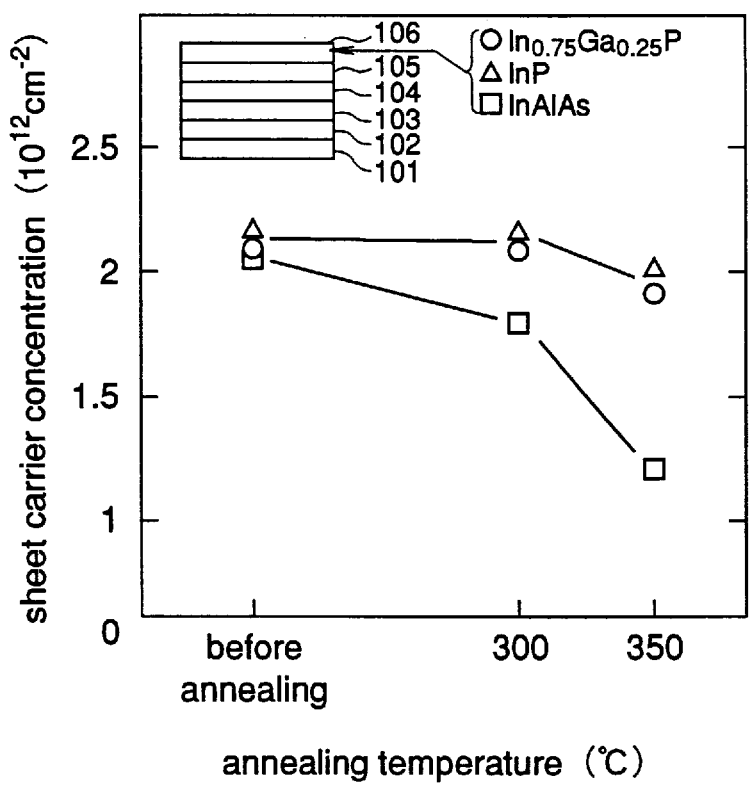
Figure 13:
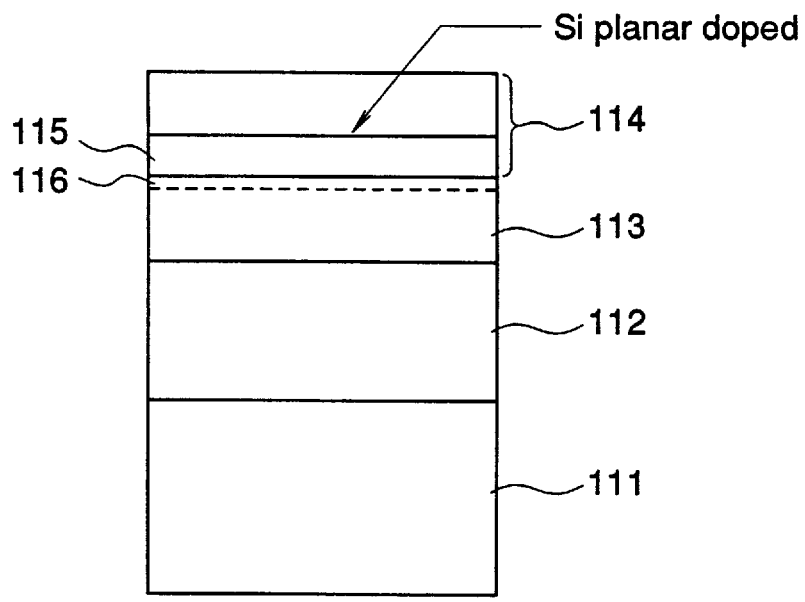
FIG. 13 is a cross-sectional view illustrating a semiconductor laminated structure used for studies of the thermal degradation of the electrical characteristics of the prior art HEMT.
Figure 14:
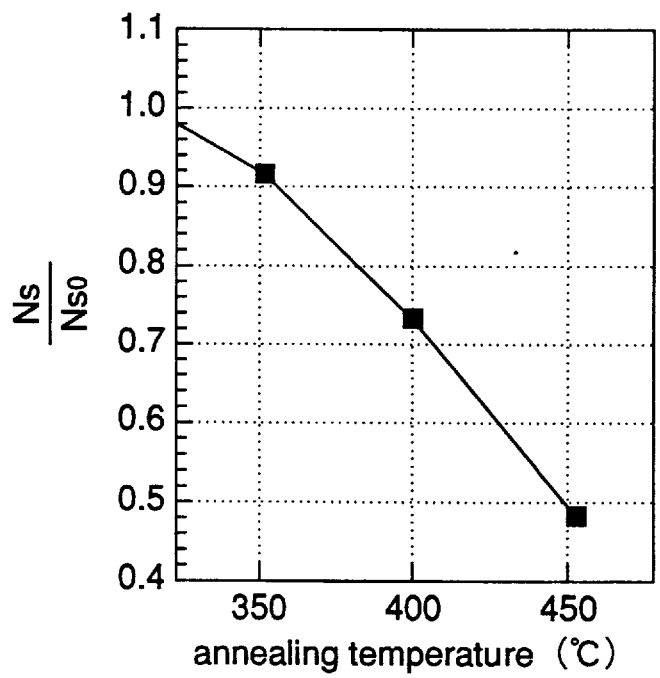
FIG. 14 is a graph showing a relationship between sheet carrier concentration and annealing temperature for explaining the thermal degradation of the electrical characteristics of the prior art HEMT.
Figure 15:
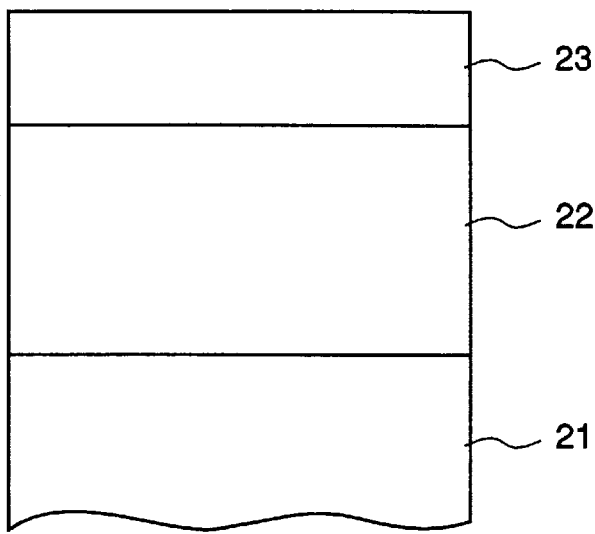
FIG. 15 is a diagram illustrating a semiconductor laminated structure used for investigating the degradation of the electrical characteristics due to the fluorine diffusion into the prior art AlInAs/GaInAs material.
Figure 16:
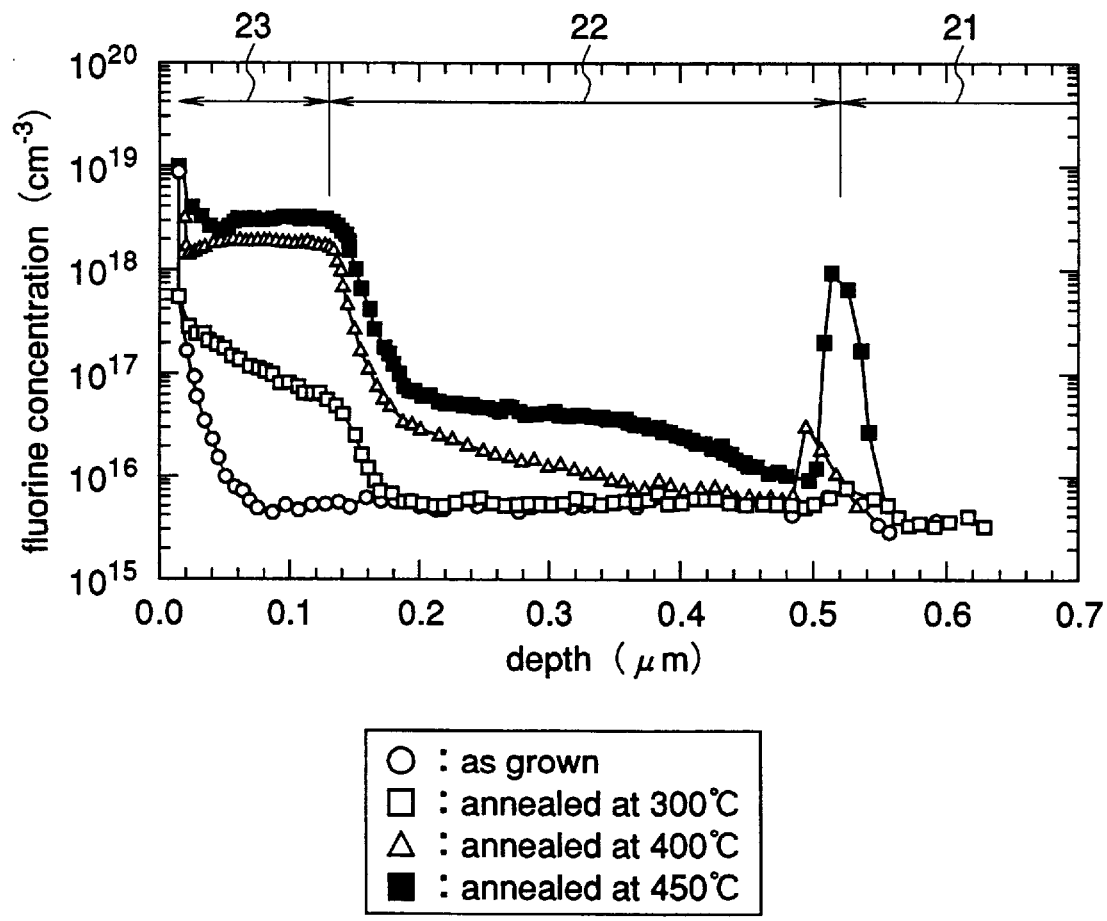
FIG. 16 is a graph showing the fluorine diffusion into the prior art AlInAs/GaInAs material caused by thermal treatment.
Figure 17:
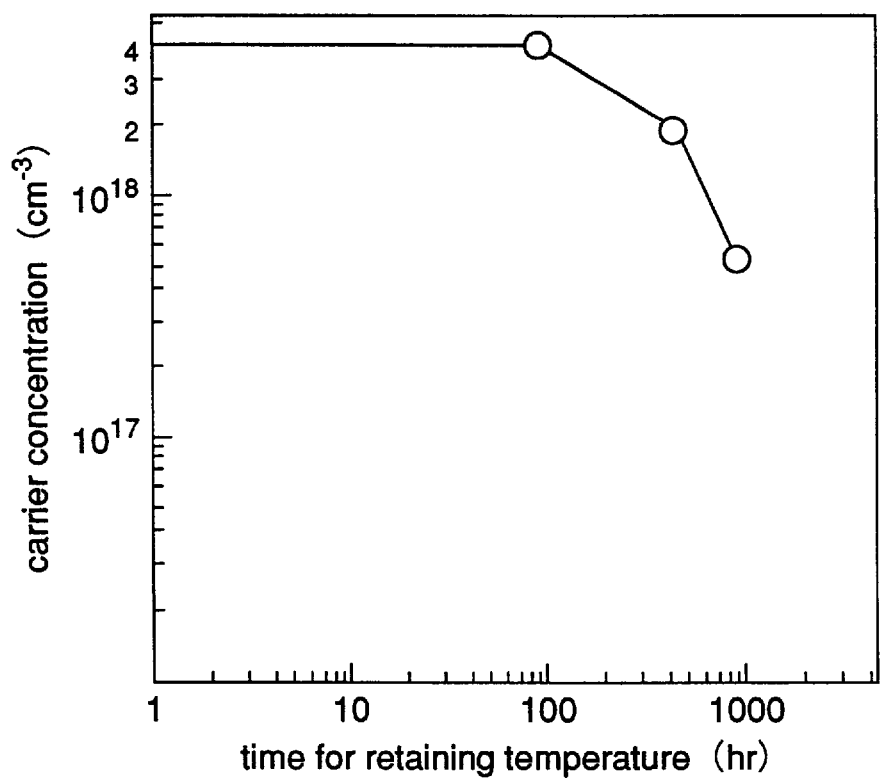
FIG. 17 is a graph showing a long-term shift of the electrical characteristics of the prior art AlInAs/GaInAs material caused by thermal treatment.

FIG. 11 is a cross-sectional view illustrating a semiconductor device as another such modification of the semiconductor device according to the fourth embodiment. In the figure, the same reference numerals as shown in FIG. 9 designate the same or corresponding parts. Reference numeral 309 designates a high concentration Si-doped GaInAs layer. In a semiconductor device as another modification of the fourth embodiment, shown in FIG. 11, electrons are supplied from the high concentration Si-doped GaInAs layer 309 directly under the drain electrode, so that the reliability of the channel doped type HFET is improved, similar to the semiconductor device according to the fourth embodiment. Further, the layer serving as the accumulator of electrons is the high concentration Si-doped GaInAs layer, and the drain electrode makes direct ohmic contact with the high concentration Si-doped GaInAs layer. Accordingly, compared with the case of the semiconductor device according to the fourth embodiment, it is possible to reduce the number of the semiconductor layers regrown and to facilitate fabrication and, furthermore, since no heterojunction is formed at the contact portion, stability of the device characteristics is improved.

What is claimed is:

1. A field effect transistor including:

a semiconductor substrate;

a buffer layer disposed on the semiconductor substrate;

source and drain electrodes;

a plurality of laminated active layers disposed on the buffer layer directly opposite the source electrode and including a heterojunction structure comprising at least two different semiconductor materials; and an n type layer for supplying electrons disposed on the buffer layer directly opposite the drain electrode, in contact with the laminated active layers, and including a dopant impurity producing n type conductivity.

2. The field effect transistor of claim 1 having a high electron mobility transistor (HEMT) structure.

3. The field effect transistor of claim 1 wherein the active layers comprise AlInAs and GaInAs.

4. The field effect transistor of claim 1 wherein the layer for supplying electrons comprises an n type AlInAs layer, the field effect transistor includes an n type GaInAs ohmic contact layer disposed on the AlInAs layer, and the drain electrode is disposed on the GaInAs ohmic contact layer.

5. The field effect transistor of claim 1 wherein the layer for supplying electrons comprises an n type GaInAs layer, and the drain electrode is disposed directly on the GaInAs layer.

6. The field effect transistor of claim 1 wherein:

the substrate is semi-insulating InP;

the buffer layer is undoped AlInAs;

the plurality of laminated active layers comprises:

an undoped GaInAs electron transit layer having a side surface and disposed on a portion of the buffer layer, an undoped AlInAs spacer layer having a side surface and disposed on the electron transit layer, an Si planar-doped layer having a side surface and disposed on the spacer layer, and an undoped AlInAs Schottky contact layer having a side surface and disposed on the Si planar-doped layer;

the layer for supplying electrons comprises an Si-doped AlInAs layer disposed on the buffer layer, in contact with the respective side surfaces of the electron transit layer, the spacer layer, the Si planar-doped layer, and the Schottky contact layer; and the field effect transistor further comprises:

a first Si-doped GaInAs ohmic contact layer disposed on the Si-doped AlInAs layer, the drain electrode being disposed on the first Si-doped GaInAs ohmic contact layer;

a gate electrode disposed on a region of the Schottky contact layer adjacent to the Si-doped AlInAs layer; and a second Si-doped GaInAs ohmic contact layer disposed on a region of the Schottky contact layer, on an opposite side of the gate electrode from the first Si-doped GaInAs ohmic contact layer, the source electrode being disposed on the second Si-doped GaInAs ohmic contact layer.

7. A field effect transistor including:

a semiconductor substrate;

a semiconductor buffer layer disposed on the substrate;

source and drain electrodes;

a plurality of laminated active layers including a heterojunction structure comprising a GaInAs electron transit layer disposed on the buffer layer, an AlInAs spacer layer, and an AlInAs Schottky layer;

first and second layers of n type AlInAs for supplying electrons, disposed on respective regions of the buffer layer directly opposite the source electrode and the drain electrode, respectively, sandwiching and in contact with respective side surfaces of the active layers, and including a dopant impurity producing n type conductivity; and n type GaInAs ohmic contact layers disposed on the first and second AlInAs layers, the drain and source electrodes being disposed on respective ohmic contact layers.

8. The field effect transistor of claim 7 having a high electron mobility transistor (HEMT) structure.

9. The field effect transistor of claim 7 wherein the active layers comprise AlInAs and GaInAs.

10. The field effect transistor of claim 7 wherein:

the substrate is semi-insulating InP;

the buffer layer is undoped AlInAs;

the plurality of laminated layer comprises:
  an undoped GaInAs electron transit layer having side surfaces and disposed on a portion of the buffer layer,
  an undoped AlInAs spacer layer having side surfaces and disposed on the electron transit layer,
  an Si planar-doped layer having side surfaces and disposed on the spacer layer, and
  an undoped AlInAs Schottky contact layer having side surfaces and disposed on the Si planar-doped layer;
the first and second layers for supplying electrons are Si-doped AlInAs layers disposed on the buffer layer on opposite sides of the electron transit layer, in contact with the respective side surfaces of the electron transit layer, the spacer layer, the Si planar-doped layer, and the Schottky contact layer;
the field effect transistor further comprises:
  a first Si-doped GaInAs ohmic contact layer disposed on the first Si-doped AlInAs layer, the drain electrode being disposed on the first Si-doped GaInAs ohmic contact layer;
  a second Si-doped GaInAs ohmic contact layer disposed on the second Si-doped AlInAs layer the source electrode being disposed on the second Si-doped GaInAs ohmic contact layer; and
  a gate electrode disposed on the Schottky contact layer.

* * * * *